US 6,539,507 B1

United States Patent
Juenemann et al.

(10) Patent No.: US 6,539,507 B1
(45) Date of Patent: Mar. 25, 2003

(54) INTEGRATED CIRCUIT WITH ALTERNATELY SELECTABLE STATE EVALUATION PROVISIONS

(75) Inventors: Christopher M Juenemann, Aurora, CO (US); Bradley J Goertzen, Ft. Collins, CO (US); Rory L Fisher, Fort Collins, CO (US); Randy L Fiscus, Ft. Collins, CO (US); Brian C Miller, Fort Collins, CO (US); Peter J Meier, Fort Collins, CO (US); Joel Buck-Gengler, Longmont, CO (US); Kenneth S Bower, Ft. Collins, CO (US); Michael R Diehl, Fort Collins, CO (US); Dale R Beucler, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/437,813

(22) Filed: Nov. 10, 1999

(51) Int. Cl.$^7$ .............................. G01R 31/28
(52) U.S. Cl. ..................................... 714/726
(58) Field of Search ........................ 714/726, 724, 714/727, 728, 730, 731

(56) References Cited

U.S. PATENT DOCUMENTS

| 4,922,492 A | * | 5/1990 | Fasang et al. | ............... 714/724 |
| 5,341,382 A | * | 8/1994 | Levitt | .................. 702/120 |
| 5,487,074 A | * | 1/1996 | Sullivan | ..................... 714/727 |

* cited by examiner

Primary Examiner—Christine T. Tu

(57) ABSTRACT

An integrated circuit incorporating test access provisions and a system addressable command control register; and provisions for selectably enabling and accessing one or the other for purposes of evaluating integrated circuit functionality.

17 Claims, 7 Drawing Sheets

FIG. 2 *(Prior Art)*

INTEGRATED CIRCUIT WITH ALTERNATELY SELECTABLE STATE EVALUATION PROVISIONS

FIELD OF THE INVENTION

The present invention relates to an apparatus for evaluating the state of an IEEE 1149.1 compliant integrated circuit (IC), in a non-test-environment, to detect errors in the integrated circuit and determine the cause of such errors while the integrated circuit is in a system environment while at the same time preserving access to, and functionality of, standard test access port hardware.

BACKGROUND OF THE INVENTION

The IEEE 1149.1 standard provides for standardized provisions on an integrated circuit to allow evaluation of the state of the integrated circuit in a test environment, removed from the system environment and placed on a tester block, to determine chip malfunctions and the cause thereof. While evaluation of an integrated circuit in a test environment is useful, it limits the ability to evaluate the integrated circuit behavior that actually occurs while in a system (non-test) environment.

One system and technique of evaluating the state of an integrated circuit is shown in FIG. 1. In this system an external tester device 11 is connected to the integrated circuit 10 and utilized to issue commands and control the integrated circuit 10 via the standard test access port (TAP) 20. The tester 11 controls the clock signal TCK, the mode select signal TMS and the reset or control signal TRST_N and inputs known data signals via TDI. More particularly, the TAP includes a state machine 22 and a scan select 21. The state machine 22 generates a series of known state signals in response to input from tester device 11. The known state signals generated by the state machine 22 are output via TAP access unit 40 to the scannable state register (30a–30e) selected (addressed) by scan select 21. These known state signals are then shifted thru the selected state register while the output of the selected state register is monitored and obtained by test device 11 via output TDO to determine if any errors have occurred and, if so, what the cause may be.

FIG. 2 illustrates TAP access unit 40 in more detail. It will be noted that in this example scannable state register unit 30 incorporates five separate state registers 30a, 30b, 30c, 30d and 30e. However, at any one time, only a single selected (addressed) state register is selected (or addressed). In order to simplify discussions herein, FIG. 2 illustrates provisions for enabling only a single one of the state registers 30a, 30b, 30c, 30d or 30e, in this example, state register 30a is shown and discussed. It will be understood by those skilled in the art, that the illustrated provisions are actually duplicated for each of the state registers 30a, 30b, 30c, 30d or 30e in an actual integrated circuit 10. Further it will be recognized that any number of state registers can be utilized provided that TAP 20, and more particularly, scan select 21, can provide for addressing each one.

A reset signal TRST_N is provided from tester 11 to each of gates 410, 420, 430, and 440 to initialize and enable functionality of test access port 20. When the test access port 20 is enabled, signal TDI from tester 11 is then provided to state register unit 30 via gate 410, as a known data input signal.

Scannable state register unit 30 is composed of multiple scannable state registers 30a–30e, each having parallel data inputs and a serial scan input. The scannable state register 30a–30e alternately operate in two modes: normal mode and test mode. The mode that the scannable state register operates in is determined by the input signal NORM. The scannable state registers 30a–30e are each clocked via clock signals from gated clock 70 during normal mode.

During test mode the clock 70 is stopped. In normal mode, the scannable state register function normally as required by system operations. In normal mode, the state registers respond to each clock signal by inputting data on the parallel data bus into the register. Scannable state register unit 30 may be implemented in different forms. For purposes of discussion, the example of a state register composed of a master node and a slave node is presented.

Signal WNORM from state machine 22 is input to scan register 30 via gate 420 as signal NORM which controls whether scannable state register unit 30 operates in normal mode, as if it is in its system environment and responsive to its parallel data inputs, or in test mode wherein it is responsive to the serial scan input SIN. SCAN_SEL (a) is received from scan select 21 to enable gate 430 and allow output of WSHIFT from state machine 22 as master shift signal NSFTMA(a). To enable (select) circuitry relevant and necessary to shifting data through the selected one of the state registers 30a–30e. Gate 430 receives an input signal WSHIFT from state machine 22. Provided SCAN_SEL (a) has been enabled, a master shift signal NSFTMA is generated and output via gate 430 to selected state register 30a to actuate, for example, a master node of state register 30a. With reference to gate 440, input signal WNNSHIFT is received from state machine 22. Provided SCAN_SEL (a) has been enabled, the state register 30a slave shift signal, NSFTSL, is output via gate 440 to actuate, for example, a slave node of a master-slave register configuration, which state register 30a may, for example, be implemented as, to shift data through the master-slave register configuration.

WSHIFT from state machine 22 provides state data to the selected state register 30a. During the shifting of state register 30a an output SOUT is obtained from the selected state register 30a and output to tester 11 via gate 450 for evaluation.

The disadvantage of this system is that it is only useful, or applicable, where the integrated circuit is in an environment in which the standard IEEE 1149.1 test access port (TAP) can be accessed and controlled. In a typical system environment, the TAP 20 is not accessible and in fact relevant inputs of the TAP 20 are held to ground level to disable the TAP 20 while the integrated circuit is in the system environment. As a result, if an integrated circuit has a malfunction that occurs only during operation in a system environment, there is no way to access and evaluate the state of the chip to determine the cause of the problem. In order to alleviate the need for removing the integrated circuit from the system environment in order to evaluate the integrated circuit the use of supplementary external hardware, included as a part of the system environment, has been proposed. Unfortunately, the addition of this supplementary external hardware is not always feasible, or possible, due to cost or system constraints. Further, while the use of proposed supplemental external hardware does allow for maintaining access to, and use of, the TAP while the integrated circuit is in a non-test environment, it introduces the risk of corruption of internal state register data during the testing process, due to the fact that the control lines for the TAP are directly controlled, or manipulated, via the external hardware. Thus, a heretofore unaddressed need exists in the industry to address the aforementioned deficiencies and inadequacies.

SUMMARY OF THE INVENTION

The present invention provides for an integrated circuit having provisions for evaluating the state of the integrated circuit. The integrated circuit incorporates a test access port and a user addressable control register. There is also provided a switching unit to allow for alternate switching between the test access port and the user addressable control register. A state register is provided which receives input from, and is controlled by, the selected one of the test access port or the user addressable control register.

The present invention seeks to provide for evaluation of an integrated circuit either in a system environment or a test environment without the necessity for the implementation of external hardware. Further, the present invention seeks to preserve access and functionality of IEEE 1149.1 TAP scan test hardware provisions by providing for selectability between standard IEEE 1149.1 TAP scan test hardware provisions of the integrated circuit chip under evaluation or a command control register implemented as a part of the integrated circuit.

Further, the present invention seeks to provide a method of evaluating an integrated circuit in a system environment. This method can be broadly conceptualized by the steps of placing the integrated circuit in test mode; providing known control data from a control register to the input of a selected scannable state register; receiving an output from the scannable state register; and providing the output to the system for evaluation.

Other features and advantages of the present invention will become apparent to one with skill in the art upon examination of the following drawings and detailed description. It is intended that all such additional features and advantages be included herein within the scope of the present invention.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

The present invention is intended to comply with the provisions of IEEE standard 1149.1, which is incorporated herein by reference. Integrated circuits are typically implemented as a part of a system ("the system") which may include other components that work cooperatively to carry out a defined operation or task. The present invention provides for the system to evaluate an integrated circuit while, for example, the integrated circuit remains in the system in which it is implemented (i.e., system environment) as opposed to being removed from the system and placed on a testing block for evaluation (i.e., test environment). It is intended that the present invention will allow for the system in which the integrated circuit is implemented, to evaluate and diagnose an integrated circuit in accordance with diagnostic routines and provisions incorporated into the system while also preserving standard test access port provisions which would allow for evaluation of the integrated circuit outside of the system environment.

Figure 5:
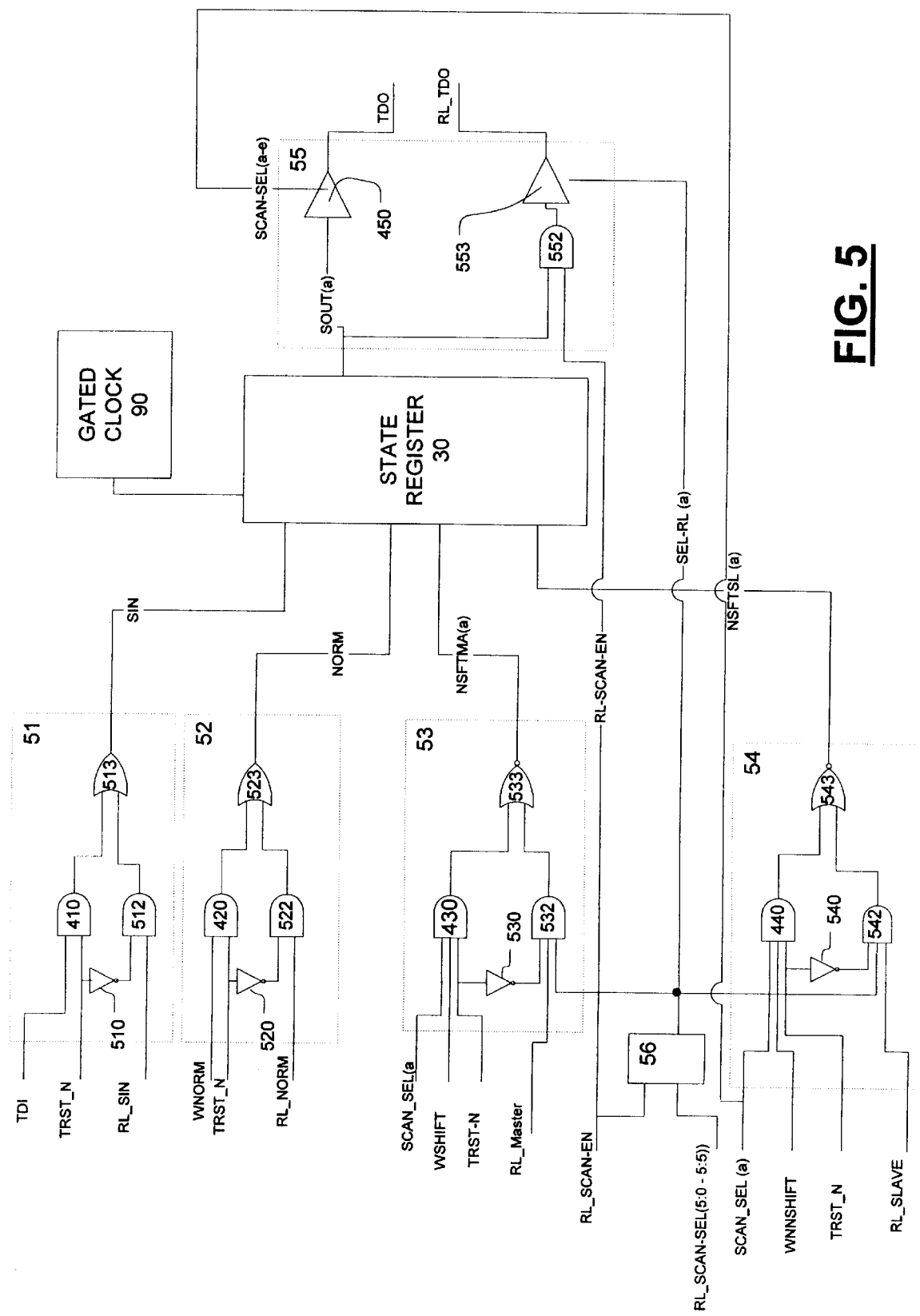
FIG. 5 is a schematic diagram illustrating details of the present invention.

With reference to FIG. 5, a scannable state register is shown. Scannable state register unit 30 is composed of multiple scannable state registers 30a–30e, each having parallel data inputs and a serial scan input. Scannable state registers 30a–30e are presented as master-slave configuration registers. However, it will be recognized and understood by those skilled in the art, that these registers can also be implemented in other ways which are equally applicable to the present invention, as long as the registers provide for scannable inputs. It will also be recognized that scannable state registers 30a–30e can be implemented in conjunction with, for example, multiplexor circuitry to provide a switching means for input to the state registers 30a–30e so as to allow for alternate input via shifted data inputs or parallel data inputs, depending upon the mode of operation (test mode or normal mode) of integrated circuit 10.

The scannable state registers 30a–30e alternately operate in two modes: normal mode and test mode. The mode that the selected scannable state registers 30a–30e operates in is determined by the input signal NORM. The scannable state registers 30a–30e are each clocked via clock signals from gated clock 90 during normal mode. During test mode the gated clock 90 is stopped. Gated clock 90 receives clock-input signals CLKIN from a separate clock source which is not shown in the drawings. This clock source may be either internal or external to integrated circuit 10. Further integrated circuit 10 may be serviced by more than one clock source, each of which should be provided to the integrated circuit 10 via a separate gated clock 90. Each clock source may also be either internal or external.

In normal mode, the selected scannable state registers 30a–30e function normally as required by system operations. In normal mode, the state registers 30a–30e respond to each clock signal from gated clock 90 by inputting data on the parallel data bus into the registers 30a–30e. In the preferred embodiment, each scannable state register 30a–30e is composed of a master node and a slave node. During evaluation of an integrated circuit, a selected scannable state register 30a–30e is placed into a test mode via a signal NORM. The addressed scannable state register 30a–30e is then input serial data SIN which is shifted thru the scannable state register and output as SOUT. The shifting of the scannable state registers 30a–30e is carried out by alternately shifting the master node and slave node of the scannable state register. Shifting of the master node is carried out in accordance with master shift signal NSFTMA, while shifting of the slave node is carried out in accordance with slave shift signal NSFTSL.

Figure 1:
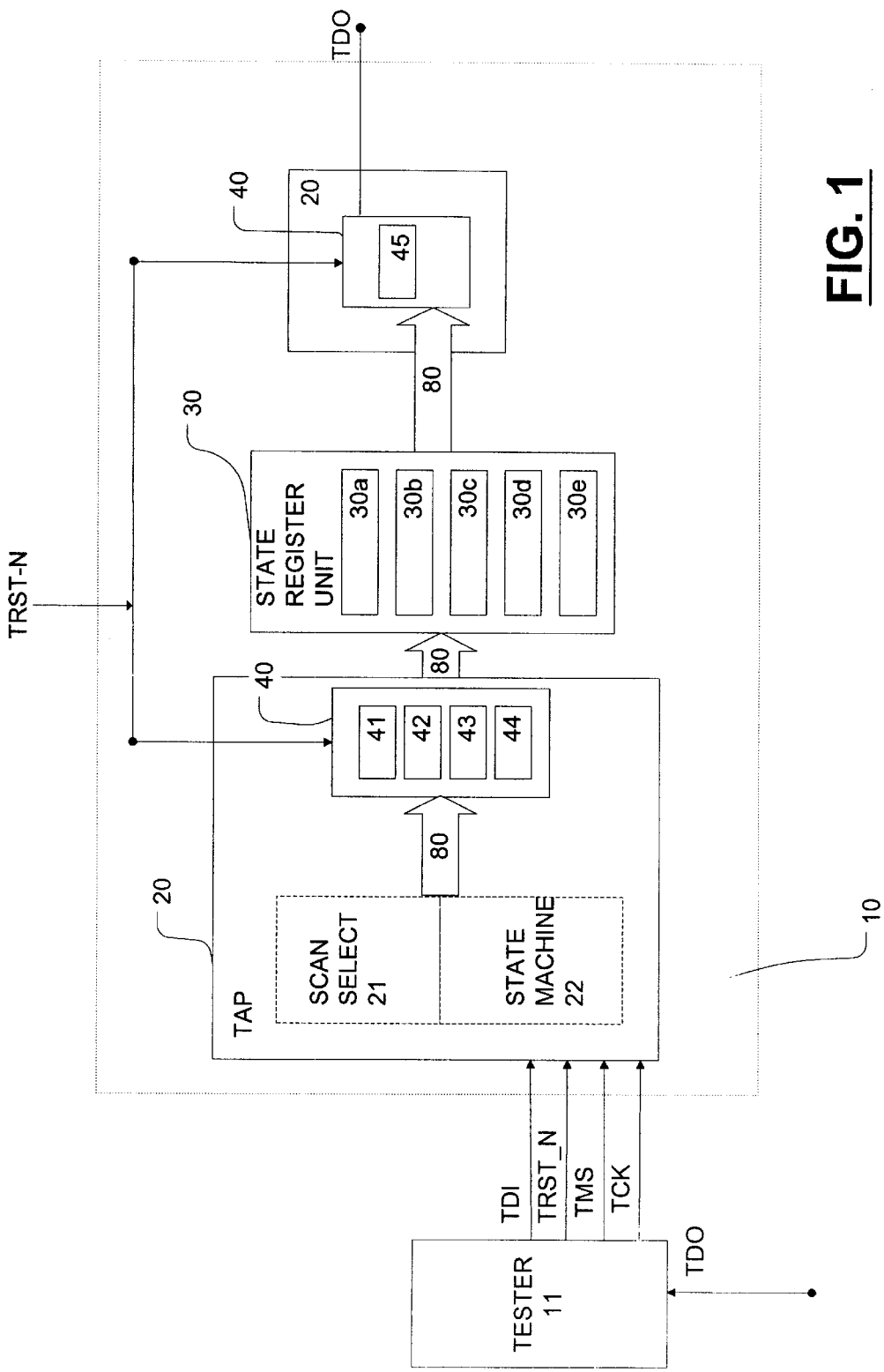
FIG. 1 is an illustration depicting an integrated circuit connected to a tester device via a standard test access port.
Figure 2:
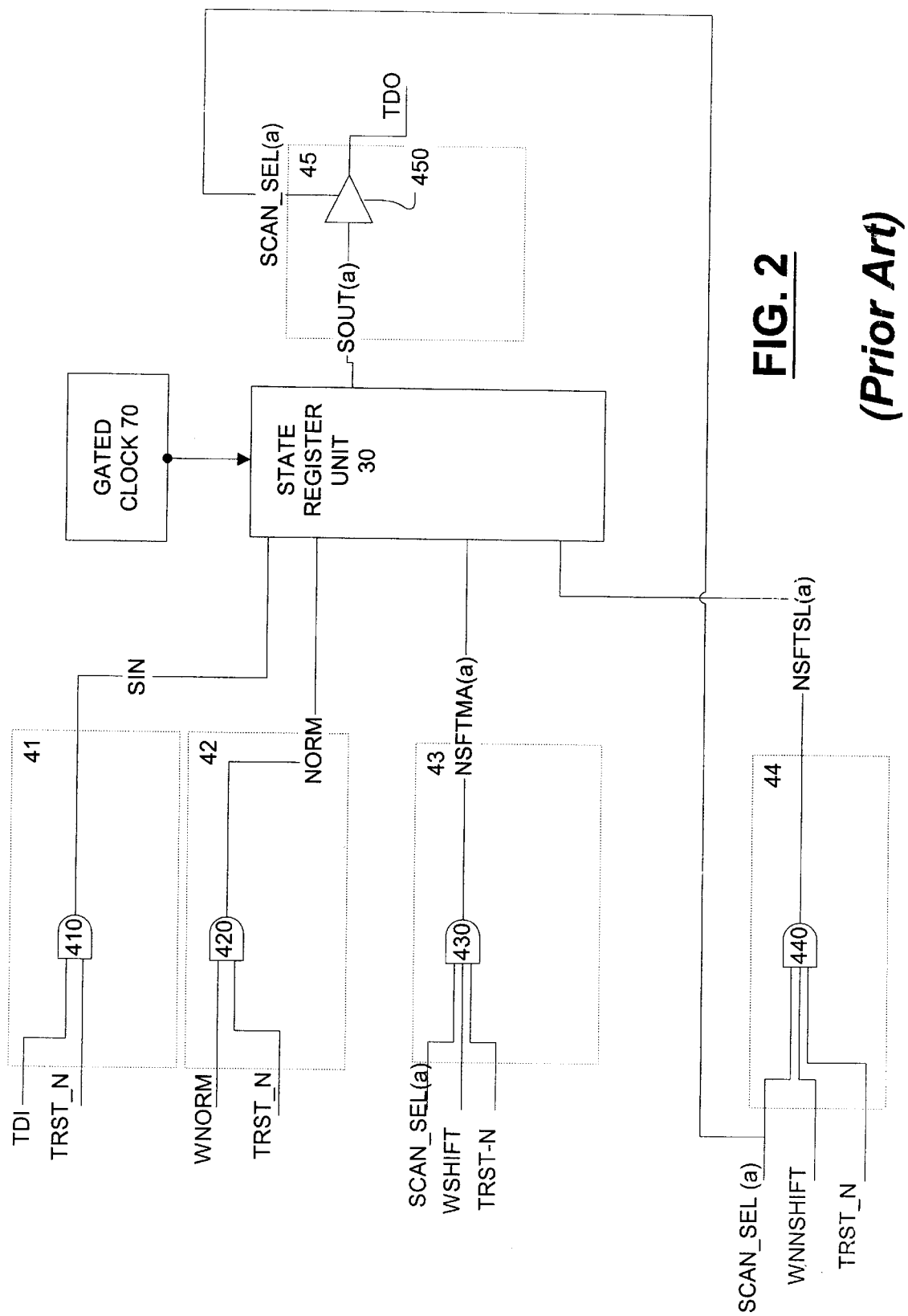
FIG. 2 is a schematic diagram depicting an integrated circuit with standard test access port provisions.
Figure 3:
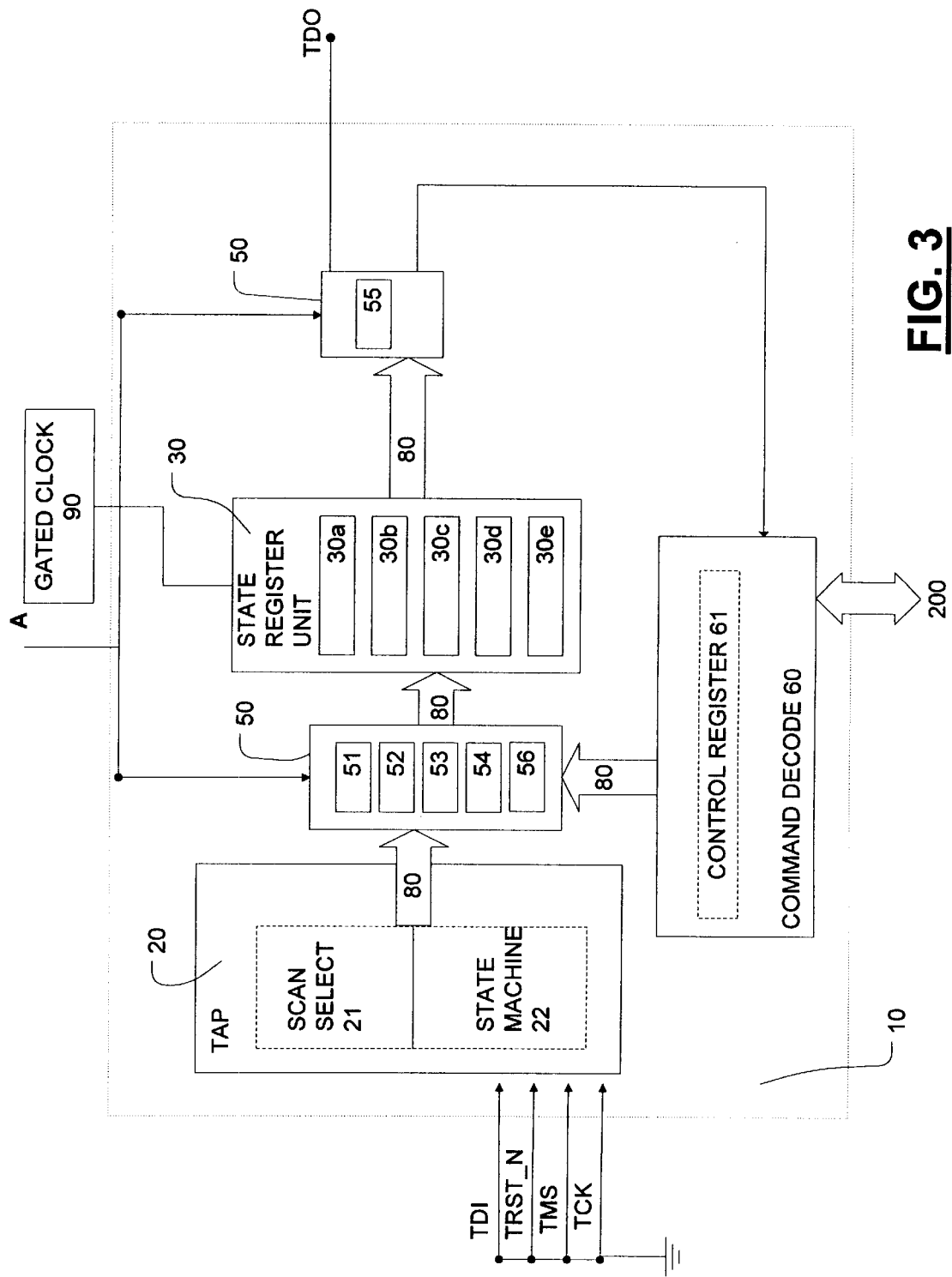
FIG. 3 is a diagram illustrating the present invention.

FIG. 3 illustrates a preferred embodiment of an integrated circuit 10 incorporating the present invention. In this illustration, there is provided a TAP 20 having scan select 21 and state machine 22. Integrated circuit 10 is shown in a system environment. TAP input lines TDI, TRST_N, TMS and TCK are held at ground level thus effectively disabling TAP 20. There is a command decode unit 60 which includes an addressable control register 61. Control register 61 is used to issue command data directly to scan register 30 via switching unit 50. Control register 61 is addressed by the system via input/output port 200 to receive command data and subsequently to issue such command data to state register block 30. The address for control register 61 is protected in order to avoid inadvertent initialization of the evaluation process by command decode section 60. Where it is desired to evaluate the state of the integrated circuit 10, the system will interact and carry out the evaluative processes via input/output port 200. Control register 61 may be addressed by the system and command data loaded from the system into control register 61. Subsequently, the command data is read out from control register 61 and routed via switching unit 50 to state register unit 30. Switching unit 50 is controlled by a control signal A. In a preferred embodiment, control signal A is the reset signal TRST_N provided to TAP 20.

For purposes of our discussions, scannable state register unit 30 includes five separate state registers 30a, 30b, 30c, 30d and 30e. These state registers are individually selected (addressed) via address signals routed from control register 61 via switching unit 50, and then provided command data from control register 61 via switching unit 50. The output of the selected one of the state registers 30a–30e is then routed to command decode section 60 via switching unit 50 where it can be written into memory, if desired, and subsequently read out via the system connected to input/output port 200. The data read out of memory can then be analyzed by the system in comparison with the command data input via control register 61 to determine if the integrated circuit produced any errors and, if so, what the causes thereof may be.

Switching block 50 is described with reference to FIG. 4 and FIG. 5. It should be noted that FIG. 5 illustrates a preferred implementation relevant to accessing and evaluating only a single selected (addressed) one of the state registers 30a–30e. In this example, state register 30a is discussed. It will be understood by those skilled in the art that it is necessary to provide for hardware shown as switching unit 53, switching unit 54 and switching unit 55 for each of the state registers 30a, 30b, 30c, 30d and 30e (or however many other state registers are provided for) in order to provide for full functionality. In a preferred embodiment, state registers 30a–30e are each composed of a master node and a slave node which are alternately shifted in order to shift test data through the register from input SIN to output SOUT.

With reference to switching blocks 51, 52, 53 and 54, it will be noted that there are inputs to each of these switching blocks that are typically provided by TAP 20. More particularly it will be noted that signals TDI, WNORM, WSHIFT, WNNSHIFT as well as SCAN_SEL (30a–30e) are typically provided via TAP 20. Where integrated circuit 10 is placed in a system environment, input signal TRST_N is preferably taken low, thereby disabling TAP 20 and enabling the input of signals directly from command decode section 60, more particularly input signals RL_SIN, RL_NORM, RL_MASTER and RL_SLAVE, as well as RL_SCAN SEL (5:0–5:5) are provided directly from command control register 61 of command decode section 60.

As state register unit 30 includes five separate state registers 30a, 30b, 30c, 30d and 30e, it will be understood that it is necessary for switching unit 50 to be configured to provide for addressing and controlling each of the state registers 30a–10e. More particularly, in order to achieve this, it is necessary for certain switch blocks of switch unit 50 to be duplicated, one for each of state registers 30a–30e. With reference to FIG. 5, it can be seen that switch blocks 53, 54 and 55 must be duplicated one for each of the state registers 30a–30e in order to service the state registers 30a–30e.

Switch blocks 51, 52, 53, 54 and 55 are utilized to essentially switch between inputs received from TAP 20 or control register 61. Switch unit 50 is composed of switch blocks 51, 52, 53, 54 and 55 which provide data signals to scan registers 30a, 30b, 30c, 30d and 30e via a bus 80. A control signal (TRST_N) is used to enable/disable the switch blocks 51–54. Depending upon the state of a control signal, where the control signal (TRST_N) is held low, input to state register unit 30 is read out from control register 61. In a typical implementation of integrated circuit 10 in a system environment, the control signal (TRST_N) will be held low so as to disable the TAP 20. In the preferred embodiment, when the signal TRST_N goes low, the switch unit 50 is engaged to cause the inputs received from control register 61 to be connected and allowed to provide address and command data signals to state register unit 30.

Where the integrated circuit 10 is placed in a test environment, for example, on a tester board connected to a tester 11, the state of control signal TRST_N will be determined by the tester 11. Where tester 11 holds the signal TRST_N high, switch units 51, 52, 53, 54 and 55 will be caused to effectively enable TAP 20 and switch the inputs and outputs of TAP 20 to provide address and command data signals to state register block 30.

With reference to FIG. 5, a preferred embodiment of the present invention is explained. Input block 51 includes AND gate 410, inverter 510, AND gate 512 and OR gate 513. Inputs TDI and TRST_N are received via TAP 20. A signal RL_SIN from control register 61 is routed via AND gate 512 to OR gate 513. Where signal TRST_N is held low (ground), the signal RL_SIN is allowed to pass via AND gate 512 to OR gate 513 from which it is subsequently output as serial scan input signal SIN to provide the selected one of scannable state registers 30a–30e with data input to be scanned (or shifted) thru the selected scannable state register. Where signal TRST_N is held high, signal RL_SIN is essentially disconnected while the input signal TDI is allowed to pass through AND gate 410 to OR gate 513 from which it is then output as serial scan signal SIN. Likewise, with reference to switch block 52, it can be seen that an input WNORM is provided from state machine 22 to one input of AND gate 420. A second input RL_NORM from control register 61 is provided to one input of AND gate 522. Where signal TRST_N is held low, the signal RL_NORM is allowed to pass through AND gate 522 to OR gate 523 from which it is subsequently output to state register block 30 as signal NORM. The NORM signal is used to control the mode of the state register block 30.

Figure 4:
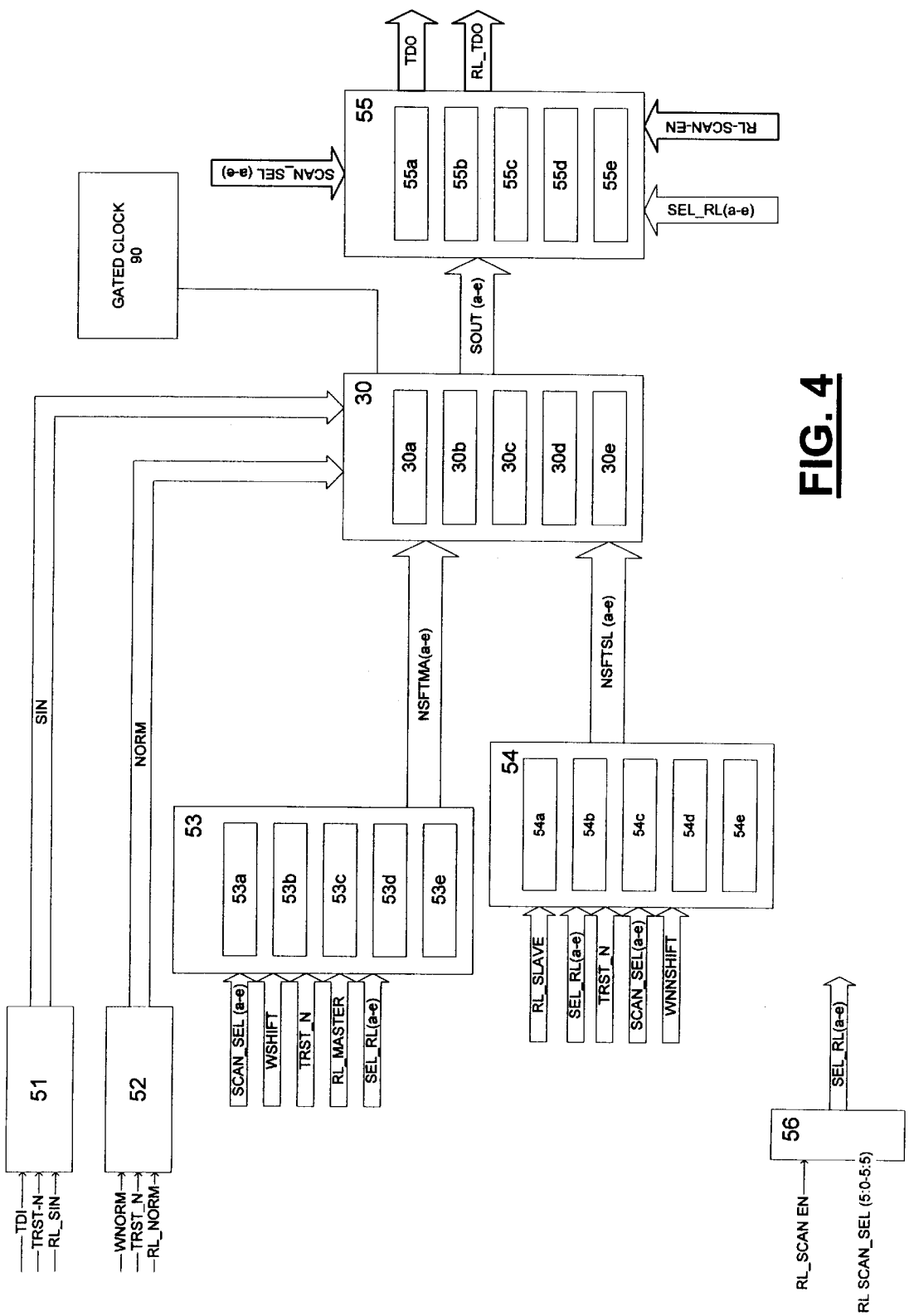
FIG. 4 is a block diagram showing the hardware necessary to service multiple state registers 30a–30e.

With reference to FIG. 4 and FIG. 5, it will be understood that switch block 51 essentially switches between input signals TDI from TAP interface 20 and signal RL_SIN from control register 61 in accordance with a reset signal TRST_N. Where signal TRST_N is low, the output RL_SIN from control register 61 will be selected and routed to the relevant state registers via bus 80 as serial input data SIN. When TRST_N is held high, the signal TDI will be routed via switch block 51. Likewise, switch block 52 essentially switches between a signal WNORM from the state machine 22 of TAP 20 and a signal RL_NORM from control register 61. The selected signal is then output as NORM which indicates to the select state register whether it is in normal mode, or test mode. It should be noted that switch block 53 essentially provides for the switching between either two inputs received from TAP 20 (SCAN_SEL (a) and WSHIFT) and two signals obtained from control register 61 (RL_MASTER) and secondary scan select unit 56 (SEL_RL (a)). Where the signal TRST_N is held low, switch block 53 will cause the inputs from control register 61 (RL_MASTER) and secondary scan select unit 56 (SEL_RL (a)) to be input and used to generate and output a master shift signal, NSFTMA (a), which is used to shift the master node of state register 30(a).

Block 54 provides for the switching between either of two inputs received from TAP 20 (SCAN_SEL (a) and WNNSHIFT) and two signals obtained from control register 61 (RL_SLAVE) and secondary scan select unit 56 (SEL_RL (a)). Where the signal TRST_N is held low, switch block 54 will cause the inputs from control register 61 (RL_SLAVE) and secondary scan select unit 56 (SEL_RL (a)) to be input and used to generate and output a slave shift signal, NSFTSL (a), which is used to shift the slave node of state register 30(a).

The known state signals generated by the command register 61 are output via switch unit 50 to the scannable state register (30a–30e) selected (addressed) by secondary scan select unit 56. These known data signals from RL_SIN are then shifted thru the selected state register in accordance with command data from control register 61 while the output of the selected state register SOUT(a) is monitored and output via switching block 55 to the control register 61 from where it is then read out by the system via input/output port 200 for evaluation and determination of whether any errors have occurred and, if so, what the cause may be. Gated clock 90 provides a clock signal to scannable state registers 30a–30e. During normal mode, the data at the parallel input ports is input into the state register block 30 in sync with each clock signal from gated clock 90. During test mode the gated clock 90 is stopped from providing clock signals to the scannable state register block; the clock is held at one state, preferably high.

Figure 7:
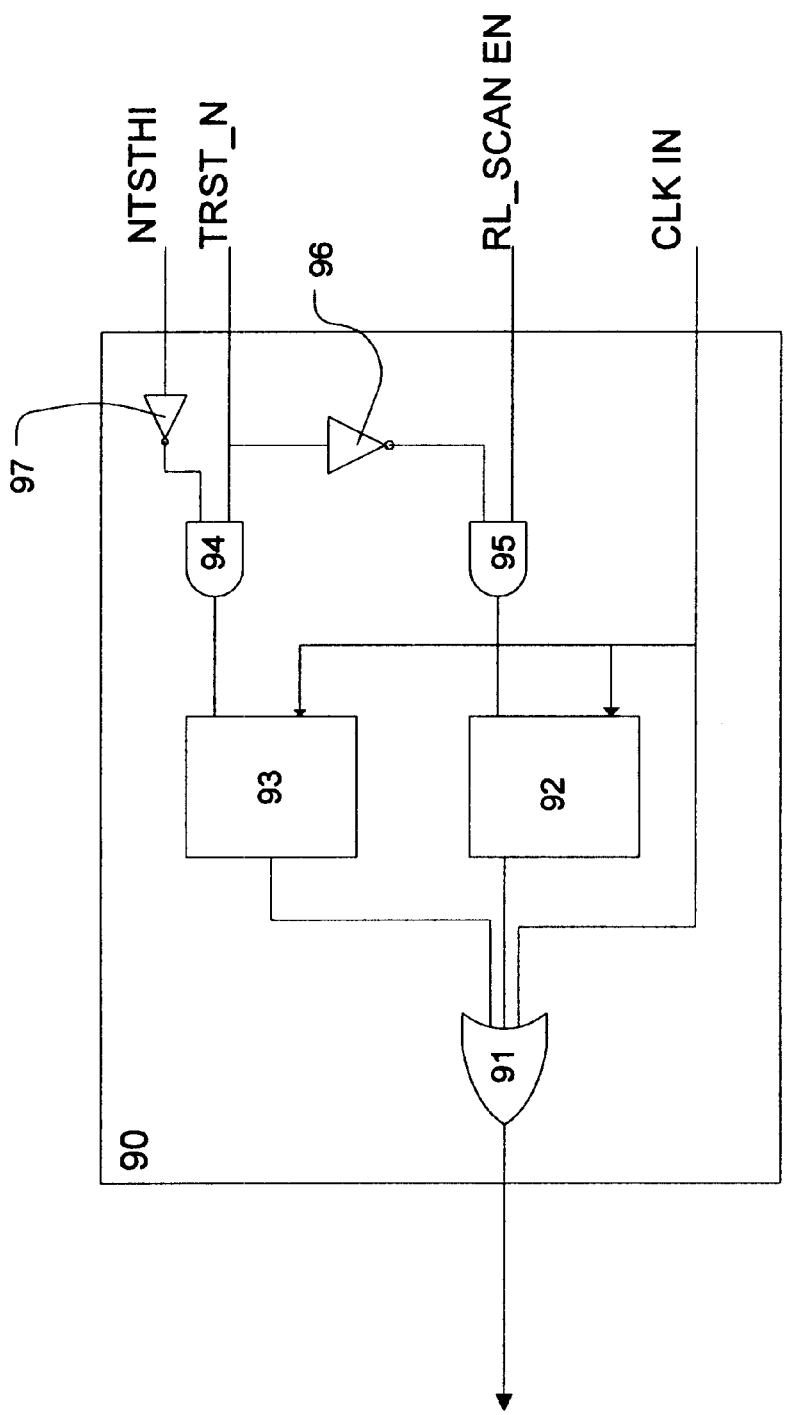
FIG. 7 is a diagram illustrating gated clock 90.

FIG. 7 illustrates a preferred implementation of gated clock 90. Non-scannable positive level sensitive latches 92 and 93 (latches 92 and 93), as well as an input of OR gate 91 are provided a clock signal via input CLK IN. Input NTSTHI is provided to the input of inverter 97. The output of AND gate 94 is provided to latch 93. The output of inverter 97 is provided to an input of AND gate 94. A signal RL_SCAN EN is provided to an input of AND gate 95. A signal TRST_N is provided to another input of AND gate 94 and to the input of inverter 96. The output of inverter 96 is provided to another input of AND gate 95. Gated clock 90 receives a clock signal via CLK IN and outputs it to the scannable state register unit 30 while the integrated circuit is operating in normal mode. Where the integrated circuit 10 is in a test mode and removed from the system environment, input signals from tester 11 force TAP state machine 22 to force the input to input NTSTHI to go low. Integrated circuit input TRST_N will be taken high and used in conjunction with input NTSTI to stop the output of the clock signal CLK IN to the state register unit 30. While integrated circuit 10 is in a test mode, and in the system environment, TRST_N would be taken low. This would allow a signal from the control register 61 (RL_SCAN EN) to be used to cause gated clock unit 90 to stop the output of the clock signal CLK IN from being output to the state register unit 30.

Figure 6:
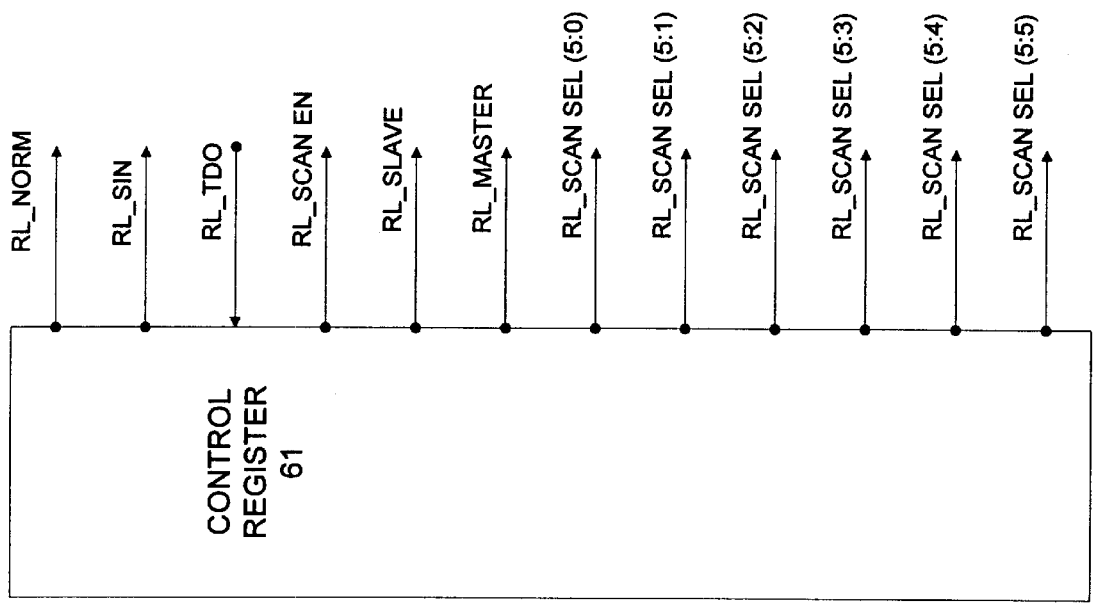
FIG. 6 is a block diagram illustrating the input and output signals of control register 61.

FIG. 6 illustrates the inputs and outputs from control register 61. RL_NORM is provided to a selected state register to determine, or set, the mode of operation of the state register (test mode or normal mode). RL_SIN when provided to the serial scan input of a selected state register 30a–30e, provides serial input state data to be shifted thru the selected state register during test mode and output as SOUT and then provided to RL_TDO, which in the preferred implementation is stored in control register 61 for subsequent output to the system via input/output port 200. RL_SLAVE controls the shifting of the slave node of the selected one of the state registers 30a–30e. RL_MASTER controls the shifting of the master node of the selected one of the state registers 30a–30e. The outputs RL_SCAN SEL (5:0–5:5) are scan select address lines which alternately enable (address) one of the state registers 30a–30e in accordance with address data input via input/output port 200 from the system and stored in control register 61.

The present invention overcomes the disadvantages of known systems and methods of evaluating an integrated circuit. More particularly, it provides full access to the standard test access port provisions for access and use when the integrated circuit is in a test environment, while also providing for a means for the system to evaluate the integrated circuit while in a non-test environment by allowing access and control via direct issuing of commands and serial state data to the select state register while the integrated circuit is in the system environment.

The present invention makes it possible to access the state of an integrated circuit chip under evaluation in most environments in which the chip may be implemented, including the production environment, the test environment or a debugging environment. Further, the present invention allows for accessing the state of the chip even if the integrated circuit is in a "hung" state as long as command decode unit 60 is accessible and functional. During the evaluation process of the present invention, it is possible to restart the clocks serving the integrated circuit while avoiding the risk of corrupting the state register data.

It will be recognized that the invention can be implemented as an integral part of the integrated circuit with minimal effort or expense and without the need for any additional supplementary hardware or software external to the system, so as to allow for system evaluation of the integrated circuit.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of the present invention and protected by the following claims.

What is claimed is:

1. An integrated circuit comprising:
   command decoder comprising input for receiving command data from a system, control register for storing said command data, output for outputting said command data;
   test access port (TAP) for receiving input from a tester and outputting test data in response thereto;
   scannable state register for receiving data via an input and shifting said data to an output; and
   switch connected to said input of said scannable state register and responsive to a control signal, for selecting between either an output of said command decoder or an output of said TAP, for input to said scannable state register.

2. An integrated circuit according to claim 1 wherein said test access port further comprises a scan select unit for generating state register address data.

3. An integrated circuit according to claim 2 wherein said test access port further comprises a state machine for generating state data.

4. An integrated circuit according to claim 1 wherein said command data comprises state data and address data.

5. An integrated circuit according to claim 1 wherein said switch comprises a plurality of logic gates.

6. An integrated circuit according to claim 1 wherein said test data comprises state data and address data.

7. An integrated circuit according to claim 1 wherein the value of said control signal is held low when the integrated circuit is installed in a system environment.

8. An integrated circuit according to claim 7 wherein said switch causes the output of said command decoder to be input to said state register when said control signal is low.

9. An integrated circuit according to claim 1 wherein said control register is addressed and enabled via a system in which said integrated circuit is implemented.

10. An integrated circuit according to claim 9 wherein the address of said control register is protected so as to avoid inadvertently enabling said control register.

11. An integrated circuit according to claim 1 wherein said state register comprises a master node and a slave node.

12. A method of evaluating an integrated circuit in a system environment comprising the steps of:

in an operation mode, providing known command control data from a control register to the input of a selected scaleable state register;

receiving an output from said scaleable state register;

providing said output to said system for evaluation; and in a test mode, providing test data from a test access port to said scannable state register, receiving an output from said scannable state register.

13. A method of evaluating an integrated circuit in a system environment according to claim 12 wherein a control signal is used to place said integrated circuit in said test mode.

14. A method according to claim 12 further comprising the step of stopping a clock signal input to said selected scannable state register, during said test mode.

15. A method of evaluating an integrated circuit in a system environment according to claim 14 wherein said command control data further comprises a data signal for placing said scannable state register into said test mode.

16. A method of evaluating an integrated circuit in a system environment according to claim 12 wherein said command control data comprises address data for selecting a scannable state register.

17. An integrated circuit comprising:

command decoder comprising means for receiving command data from a system, means for storing said command data, means for outputting said command data;

test access port for receiving input from a tester and outputting test data in response thereto;

means for receiving data via an input and shifting said data to an output; and switching means connected to said input of said means for receiving data, responsive to a control signal, for selecting between said output of said command decoder or said test access port, for input to said state register.

* * * * *